(12) United States Patent
Kartadihardja et al.

(10) Patent No.: US 11,464,118 B2
(45) Date of Patent: Oct. 4, 2022

(54) METHOD FOR MANUFACTURING ELECTRONIC DEVICE

(71) Applicant: PCI Private Limited, Singapore (SG)

(72) Inventors: Handi Kartadihardja, Singapore (SG); Nelson Ranola, Singapore (SG); Chi Wei Yap, Singapore (SG); Stephen Conner, Singapore (SG)

(73) Assignee: PCI PRIVATE LIMITED, Singapore (SG)

( * ) Notice: Subject to any disclaimer, the term of this patent is extended or adjusted under 35 U.S.C. 154(b) by 95 days.

(21) Appl. No.: 16/933,418

(22) Filed: Jul. 20, 2020

(65) Prior Publication Data

US 2021/0029833 A1 Jan. 28, 2021

(30) Foreign Application Priority Data

Jul. 25, 2019 (SG) .......................... 10201906867R

(51) Int. Cl.
*H05K 3/30* (2006.01)
*H01Q 1/22* (2006.01)
*H01Q 1/42* (2006.01)
*H05K 3/28* (2006.01)

(52) U.S. Cl.
CPC .............. *H05K 3/303* (2013.01); *H01Q 1/22* (2013.01); *H01Q 1/42* (2013.01); *H05K 3/284* (2013.01); *H05K 2203/1316* (2013.01)

(58) Field of Classification Search
CPC ................... H05K 3/303; H05K 3/284; H05K 2203/1316; H01Q 1/22; Y10T 29/49126; Y10T 29/49146

USPC ........................................... 29/830, 832, 841
See application file for complete search history.

(56) References Cited

U.S. PATENT DOCUMENTS

| 6,060,342 | A | 5/2000 | Montauti et al. | |
| 7,476,566 | B2 * | 1/2009 | Farrell | H01L 21/50 |
| | | | | 257/704 |
| 7,528,790 | B2 * | 5/2009 | Desclos | H01Q 1/52 |
| | | | | 343/700 MS |
| 10,037,951 | B2 * | 7/2018 | Shen | H01L 24/81 |
| 10,709,009 | B2 * | 7/2020 | Hauslmann | H05K 3/284 |
| 2001/0054780 | A1 | 12/2001 | Ogura | |
| 2002/0180602 | A1 | 12/2002 | Yoakum | |

(Continued)

FOREIGN PATENT DOCUMENTS

| DE | 4414005 A1 | 11/1994 |
| DE | 10162450 A1 | 7/2003 |

(Continued)

OTHER PUBLICATIONS

Written Opinion in reference to co-pending Singapore Patent Application No. 10201906867R filed Jul. 25, 2019.

(Continued)

*Primary Examiner* — Donghai D Nguyen
(74) *Attorney, Agent, or Firm* — Dinsmore & Shohl LLP

(57) ABSTRACT

Methods for manufacturing an electronic device include providing a substrate having a plurality of radio-frequency components provided thereon, the radio-frequency components including an antenna and a matching circuitry. A cap is attached to the substrate over the antenna and the matching circuitry and a molding operation is performed to encapsulate the cap and at least a portion of the substrate with a mold compound.

11 Claims, 8 Drawing Sheets

(56) References Cited

U.S. PATENT DOCUMENTS

| | | |
|---|---|---|
| 2003/0076662 A1 | 4/2003 | Miehling |
| 2005/0078040 A1 | 4/2005 | Minoura et al. |
| 2007/0171076 A1 | 7/2007 | Stevens et al. |
| 2008/0096326 A1 | 4/2008 | Reed |
| 2008/0282540 A1 | 11/2008 | Singleton |
| 2008/0309574 A1 | 12/2008 | Desclos et al. |
| 2009/0295675 A1 | 12/2009 | Tang |
| 2010/0033400 A1 | 2/2010 | Chang et al. |
| 2010/0259393 A1 | 10/2010 | Marur et al. |
| 2013/0293428 A1 | 11/2013 | Souriau et al. |
| 2014/0131454 A1 | 5/2014 | Weisshaupt et al. |
| 2016/0006131 A1 | 1/2016 | Matsumura et al. |
| 2017/0332482 A1 | 11/2017 | Hauslmann |
| 2018/0169917 A1 | 6/2018 | Chang et al. |

FOREIGN PATENT DOCUMENTS

| | | |
|---|---|---|
| EP | 1123792 A1 | 8/2001 |
| JP | 8276458 | 10/1996 |
| WO | 0025264 A1 | 5/2000 |

OTHER PUBLICATIONS

Intellectual Property Office of Singapore Search Report dated Jun. 23, 2020 in related Singapore Application No. 10201906867R.
European Search Report in reference to co-pending European Patent Application No. 20183031.2 filed Apr. 12, 2020.
Ongkiehong, et al., "How to process compares to potting and injection molding", Printed Circuit Design & Fab Circuits Assembly, pp. 1-4, Dec. 2005.

\* cited by examiner

METHOD FOR MANUFACTURING ELECTRONIC DEVICE

CROSS REFERENCE TO RELATED APPLICATION

This application claims the benefit of priority under 35 U.S.C. § 119 to Singapore Application No. 10201906867R, filed Jul. 25, 2019, which application is hereby incorporated by reference herein in its entirety.

TECHNICAL FIELD

This disclosure relates to the field of radio frequency engineering and more particularly to a method for manufacturing an electronic device.

BACKGROUND

Electronic devices that transmit radio frequency (RF) signals are required to emit RF signals within a specified frequency range according to an intended RF standard. If an RF electronic device operates outside its intended band of frequencies, it would cause interference and even be illegal. It is therefore desirable to provide a method for manufacturing an electronic device that performs consistently within an intended frequency range.

SUMMARY

Accordingly, in a first aspect, the present disclosure provides a method for manufacturing an electronic device. The method includes providing a substrate having a plurality of radio-frequency components provided thereon, the radio-frequency components including an antenna and a matching circuitry. A cap is attached to the substrate over the antenna and the matching circuitry and a molding operation is performed to encapsulate the cap and at least a portion of the substrate with a mold compound.

Other aspects and advantages of the invention will become apparent from the following detailed description, taken in conjunction with the accompanying drawings, illustrating by way of example the principles of the invention.

BRIEF DESCRIPTION OF THE DRAWINGS

Embodiments will now be described, by way of example only, with reference to the accompanying drawings, in which.

DETAILED DESCRIPTION

The detailed description set forth below in connection with the appended drawings is intended as a description of presently preferred embodiments, and is not intended to represent the only forms in which the present invention may be practiced. It is to be understood that the same or equivalent functions may be accomplished by different embodiments that are intended to be encompassed within the scope of the invention.

A method for manufacturing an electronic device 10 will now be described below with reference to FIGS. 1A through 1E.

Figure 1A:
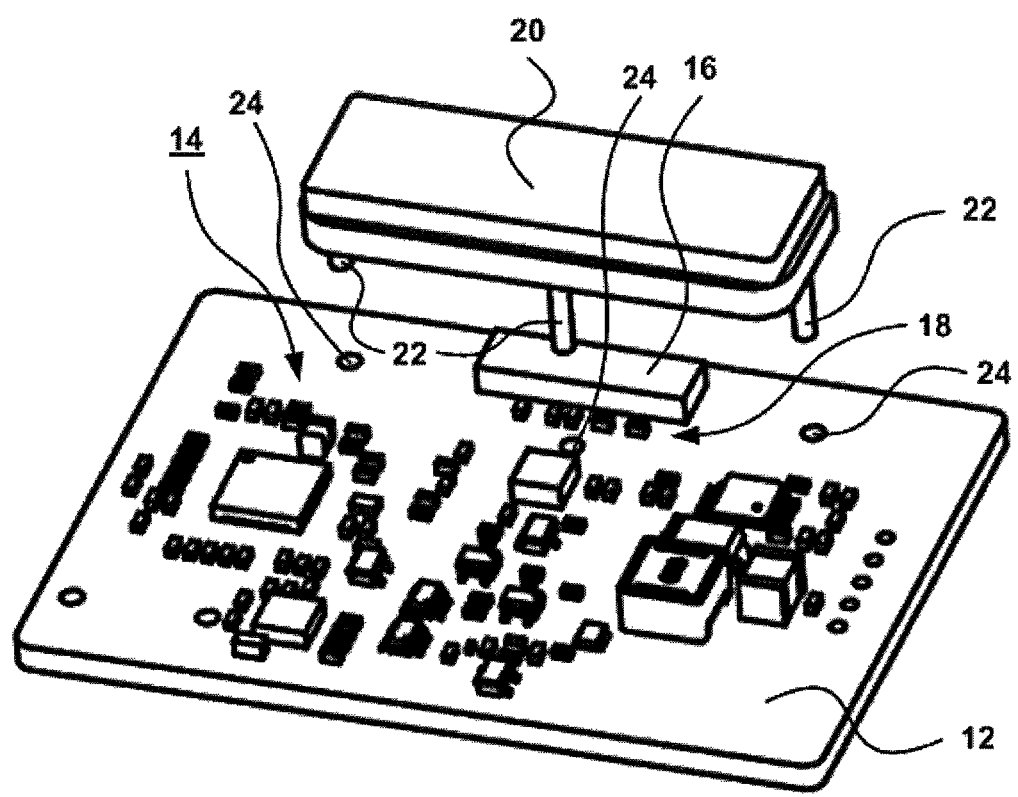
FIGS. 1A through 1E are schematic perspective views illustrating a method for manufacturing an electronic device in accordance with an embodiment disclosed herein.

Referring now to FIG. 1A, a substrate 12 having a plurality of radio-frequency components 14 provided thereon is provided as shown. The radio-frequency components include an antenna 16 and a matching circuitry 18.

In the embodiment shown, the substrate 12 and the radio-frequency components 14 are provided in the form of a radio frequency (RF) radio module with associated circuitry on a printed circuit board (PCB). The antenna 16 and the matching circuitry 18 are configured to transmit the RF signal. The matching circuitry 18 is formed of a set of electronic components that are used to fine tune a frequency at which the antenna 16 outputs.

Figure 1B:
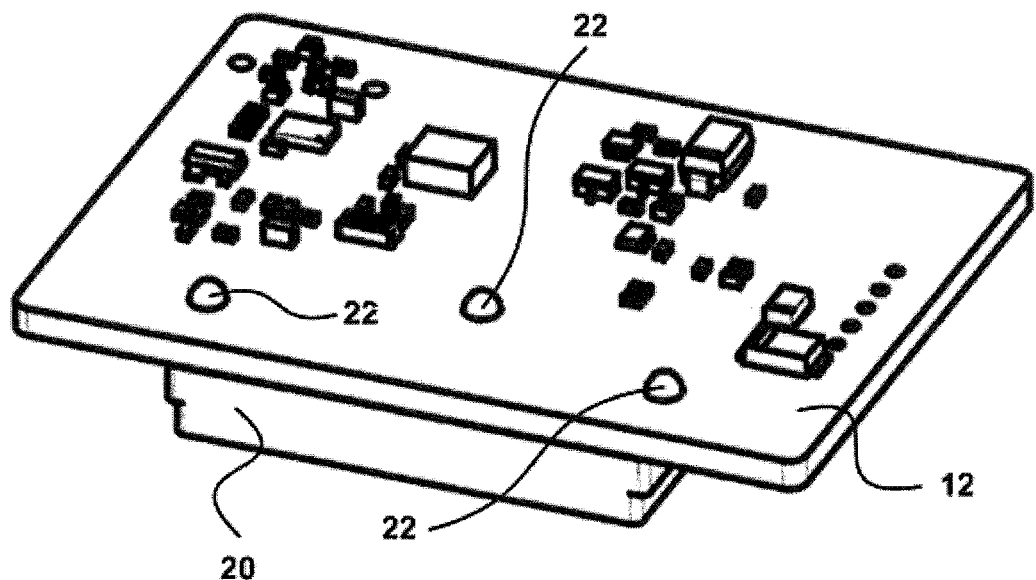
Figure 1C:
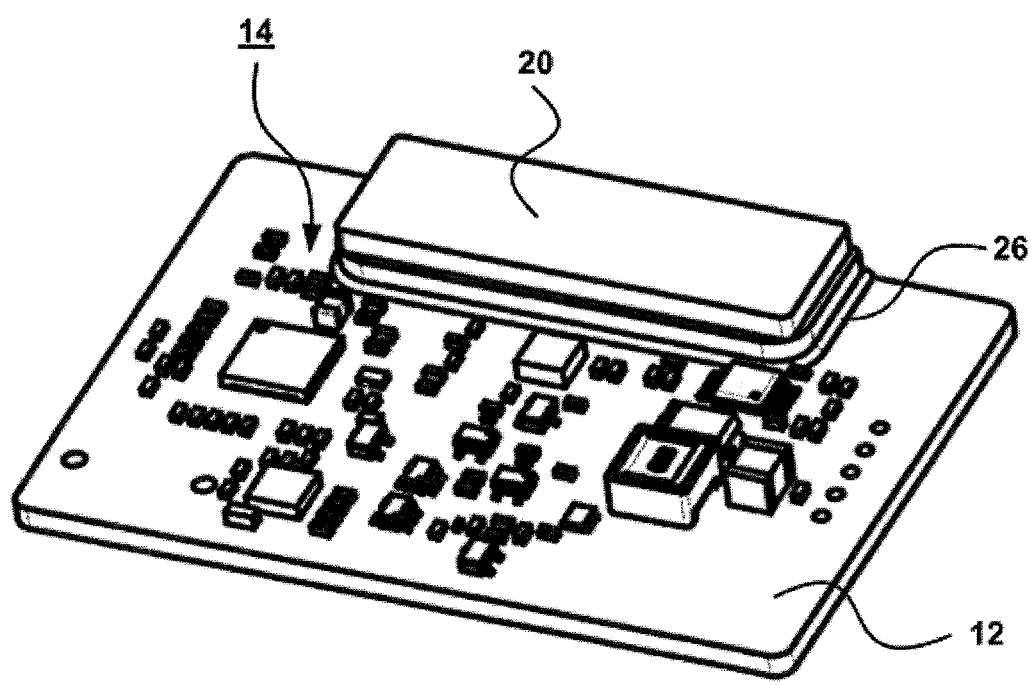

Referring now to FIGS. 1A through 1C, a cap or cover 20 is attached to the substrate 12 over the antenna 16 and the matching circuitry 18.

This may involve aligning a plurality of pins 22 of the cap 20 with corresponding ones of a plurality of holes 24 in the substrate 12. In the present embodiment, the cap 20 is located in place using the locating pins 22 at each end of the cap 20 which are received in the matching holes 24 in the substrate 12. In an alternative embodiment, the pins 22 may be located at one or more corners of the cap 20.

The cap 20 may then be heat staked to the substrate 12 by means of the pins 22. After heat staking, the heat staked pins 22 form respective rivets that help hold the cap 20 in place during subsequent processing steps and prevent seepage of mold compound into an air space beneath the cap 20. In this manner, the cap 20 may be anchored to the substrate 12.

In the present embodiment, the substrate 12 is designed such that there are no open via holes in the area covered by the cap 20. This is so that mold compound cannot enter into the space under the cap 20 through an open via hole.

In the same or a different embodiment, the cap 20 may be bonded to the substrate 23 with an adhesive 26. The adhesive 26 may be a room temperature vulcanizing silicone. Advantageously, the adhesive 26 helps to seal the cap 20 and prevent mold compound from intruding into antenna area under the cap 20.

The cap 20 is positioned to cover the antenna 16 and the matching circuitry 18 and serves to protect the antenna 16 and the matching circuitry 18 from an external environment, providing a sealed environment for the electronics within to operate. A transceiver (not shown) may also be covered by the cap 20. The pre-formed cap 20 may be machined from a polycarbonate material or may be made of another type of material that would allow RF to radiate through. In the present embodiment, the cap 20 is machined with the pins 22 on either side from polycarbonate to fit over the antenna 16 and the matching circuitry 18.

Figure 1D:
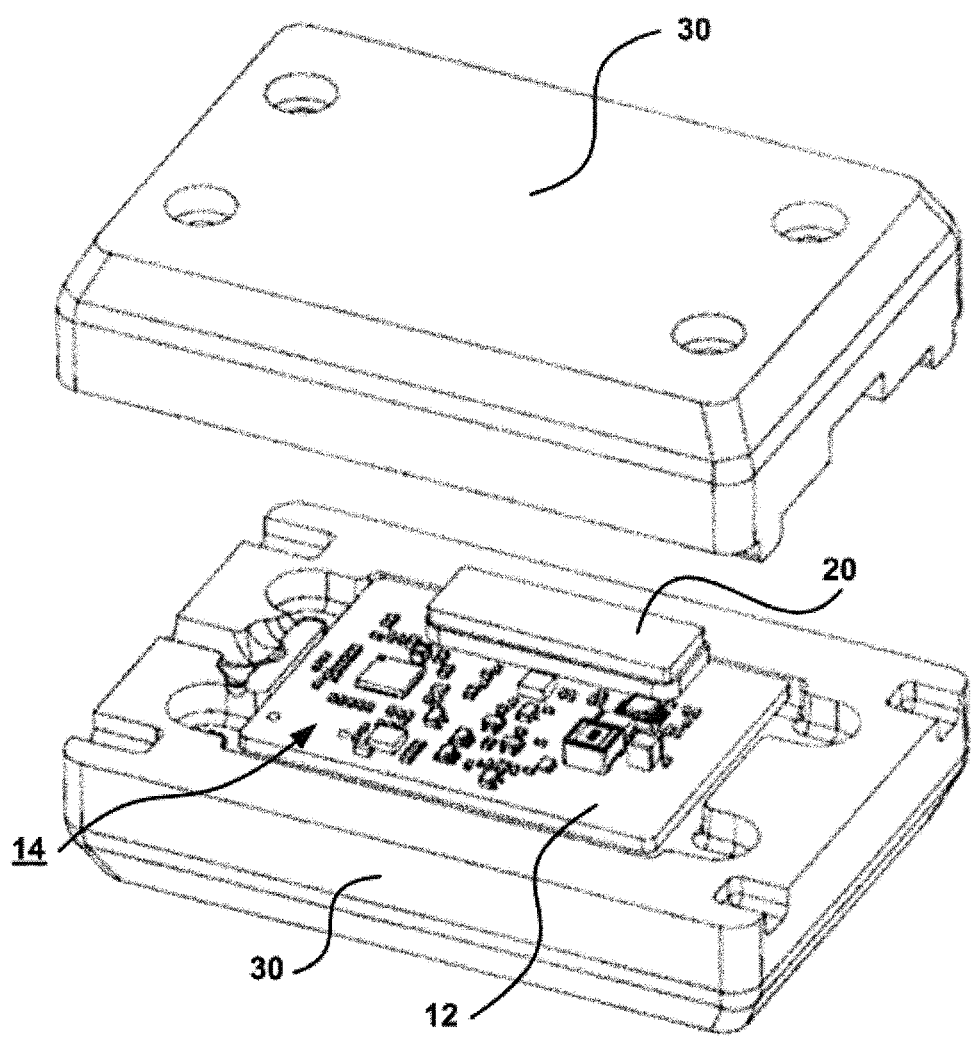
Figure 1E:
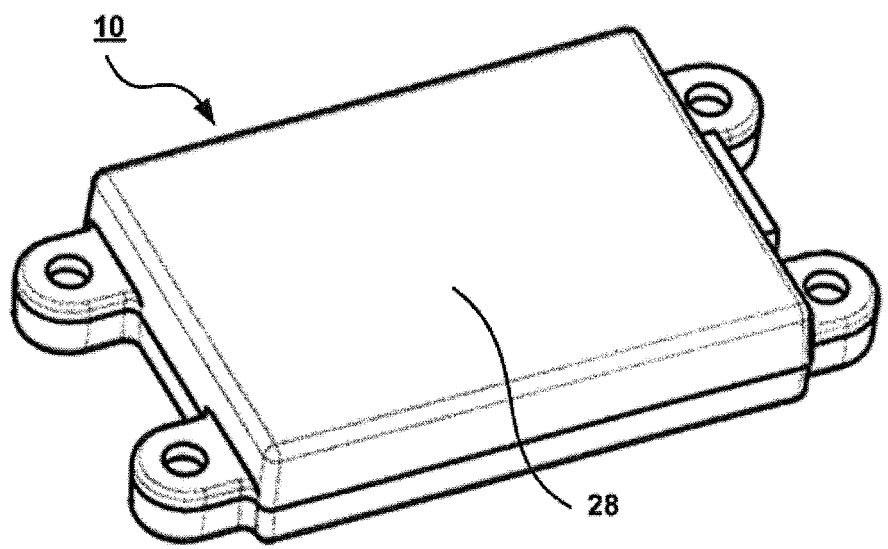

Referring now to FIGS. 1D and 1E, a molding operation is performed to encapsulate the cap 20 and at least a portion of the substrate 12 with a mold compound 28. This may be by placing the substrate 12 with the antenna 16 and the matching circuitry 18 sealed by the cap 20 in a mold 30 and injecting the mold compound 28 into the mold 30 at an injection pressure of between about 1.02 kilograms per square centimeter ($kg/cm^2$) and about 61.2 $kg/cm^2$ and an injection temperature of from about 170 degrees Celsius (° C.) to about 240° C.

The mold 30 in which the substrate 12 and the sealed cap 20 are enclosed may be designed for low pressure overmolding.

The mold compound 28 protects the radio-frequency components 14 from the external environment and is of a type of material that would allow RF to radiate through. In one embodiment, the mold compound 28 may be a hot melt polyamide material such as, for example, TECH-NOMELT®, and may be injected into the mold 30 at a temperature of about 180 degrees Celsius (° C.) and an injection pressure of about 2.5 $kg/cm^2$ for an injection period of about 8 seconds (s). The mold compound 28 may then be held in the mold 30 for a holding time of about 15 s before being cooled for a cooling period of about 80 s.

By enclosing the radio-frequency components 14 within a low pressure overmolded material, a sealed environment is provided for the electronics within to operate.

Further advantageously, by providing a sealed cap 20 over the antenna 16 and the matching circuitry 18 before performing the molding operation, inconsistencies that may have arisen due to how molding material flows over the antenna 16 during the injection process and void formation within the overmold preventing the antenna 16 and the matching circuitry 18 from being evenly coated may be eliminated.

The electronic device 10 that is produced from the manufacturing method described above may then be removed from the mold 30 and is ready for testing.

To account for differences when the antenna 16 is enclosed by the mold compound 28 as opposed to air, the matching circuitry 18 may be optimized against a plurality of reference parameters from an unencapsulated antenna before attaching the cap 20 to the substrate 12 to adjust a frequency of transmission back to a frequency of interest. The reference parameters may be obtained by measuring the antenna performance of a reference sample of an unencapsulated RF radio with matching circuitry and storing the RF performance parameters obtained as a reference.

Figure 2:
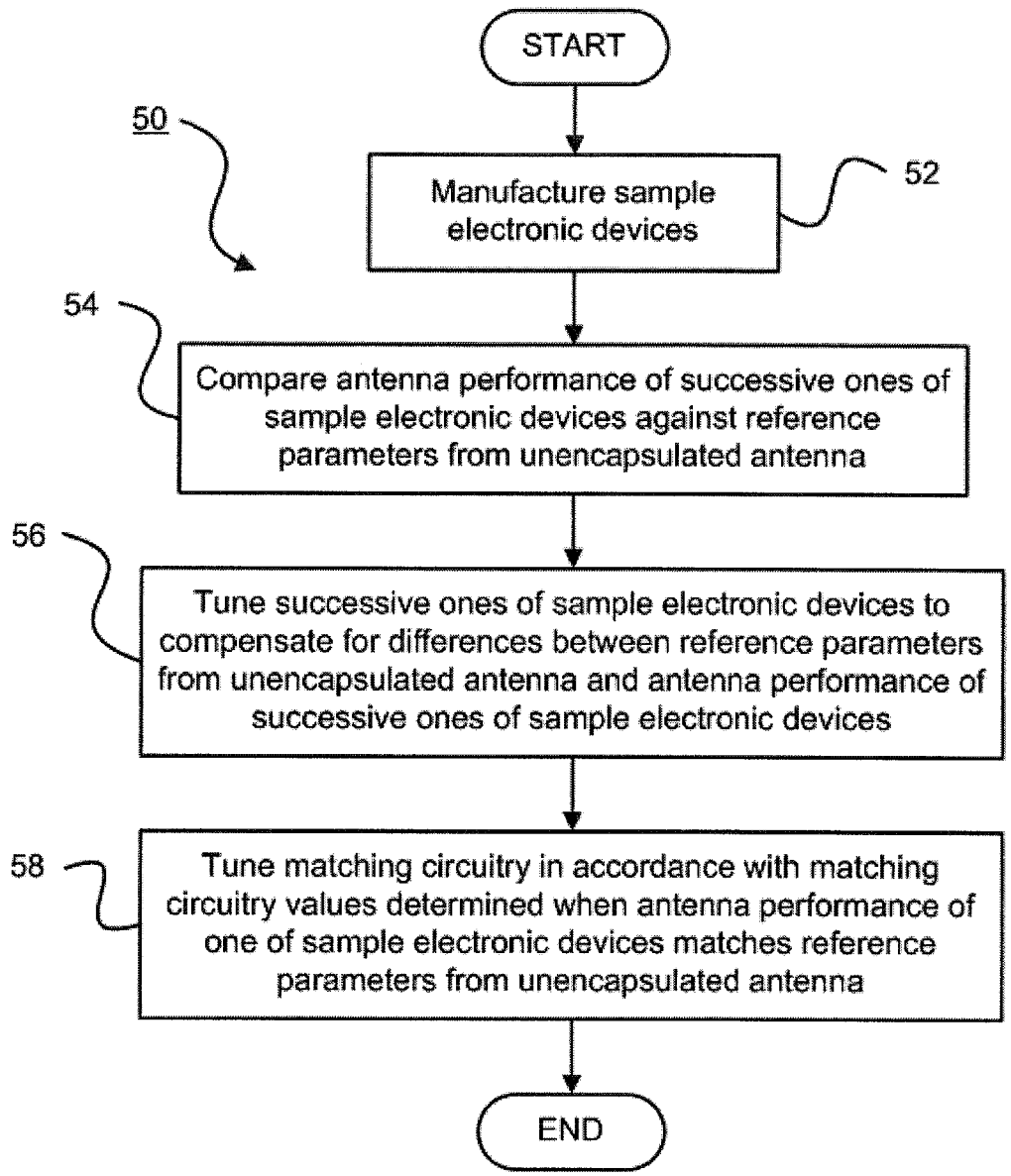
FIG. 2 is a schematic flow diagram illustrating a method for optimizing a matching circuitry of the electronic device in accordance with an embodiment disclosed herein.

Referring now to FIG. 2, a method 50 for optimizing the matching circuitry 16 of the electronic device 10 will now be described. The method 50 begins at step 52 by manufacturing a plurality of sample electronic devices. Several identical samples of the reference sample may be made and a first one of them may then be encapsulated using the manufacturing method described above with reference to FIGS. 1A through 1E, in particular, with the antenna and the matching circuitry covered by a cap before encapsulating the entire device.

At step 54, an antenna performance of successive ones of the sample electronic devices is compared against the reference parameters from the unencapsulated antenna. The first encapsulated sample may be measured to obtain the RF antenna and matching circuitry performance parameters. These parameters are then compared with the reference parameters.

At step 56, the successive ones of the sample electronic devices may be tuned to compensate for differences between the reference parameters from the unencapsulated antenna and the antenna performance of the successive ones of the sample electronic devices. Any shift in performance may be corrected by calculation and new matching circuitry values may be obtained by compensating for any shift in performance as measured in the encapsulated unit.

The optimization steps are repeated with new matching circuitry values used in each iteration until the performance of the encapsulated unit is equivalent to the reference sample.

The matching circuitry 18 may then be tuned at step 58 in accordance with a plurality of matching circuitry values determined when the antenna performance of one of the sample electronic devices matches the reference parameters from the unencapsulated antenna. In this manner, the electronic devices 10 manufactured in accordance with the above described manufacturing method may be optimized for consistent performance despite being encapsulated.

EXAMPLES

Experiments were performed to study the RF performance and return loss of three (3) electronic devices 10 formed in accordance with embodiments of the present invention and this was compared to that of three (3) electronic devices encapsulated using low pressure molding directly onto the electronic circuit without using a cap to cover the antenna and the matching circuitry as a control. The results of the experiments are shown in FIGS. 3, 4A through 4C and 5A through 5C.

Figure 3:
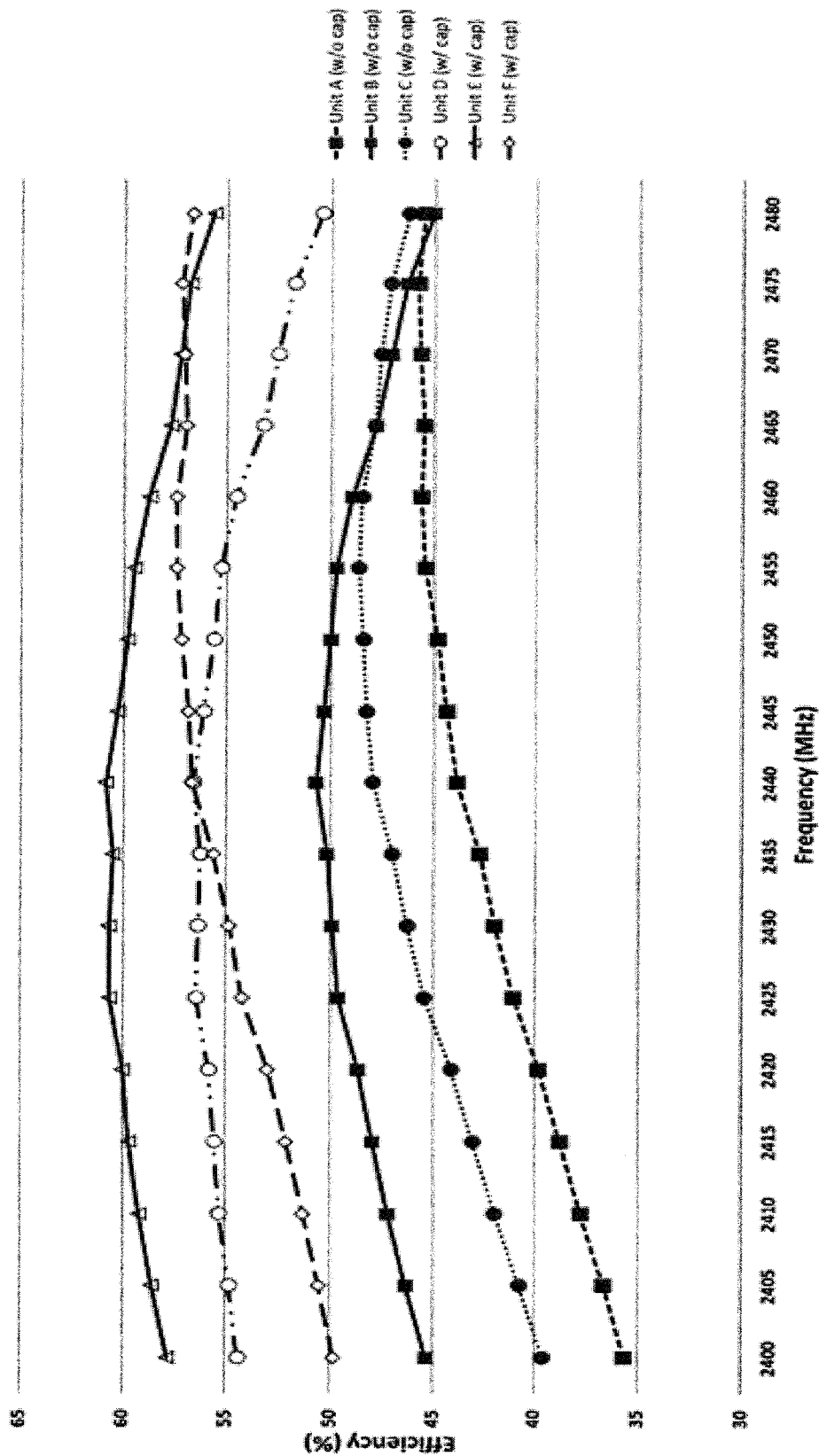
FIG. 3 is a graph showing radio frequency (RF) performances of three (3) electronic devices manufactured in accordance with embodiments disclosed herein as compared to three (3) electronic devices encapsulated without first attaching a cap over respective antennas and matching circuitry across the 2.4 GHz ISM band.
Figure 4A:
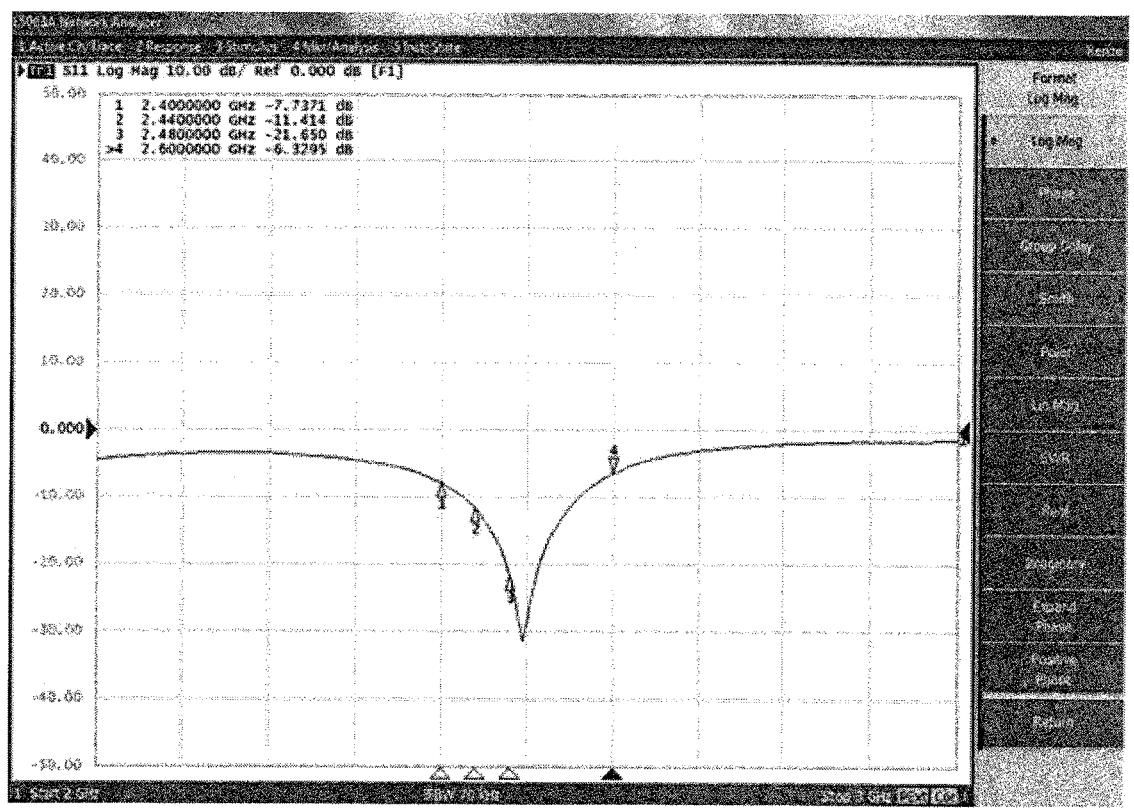
FIGS. 4A, 4B and 4C are graphs showing return loss of three (3) electronic devices encapsulated without first attaching a cap over respective antennas and matching circuitry across the 2.4 GHz ISM band.
Figure 4B:
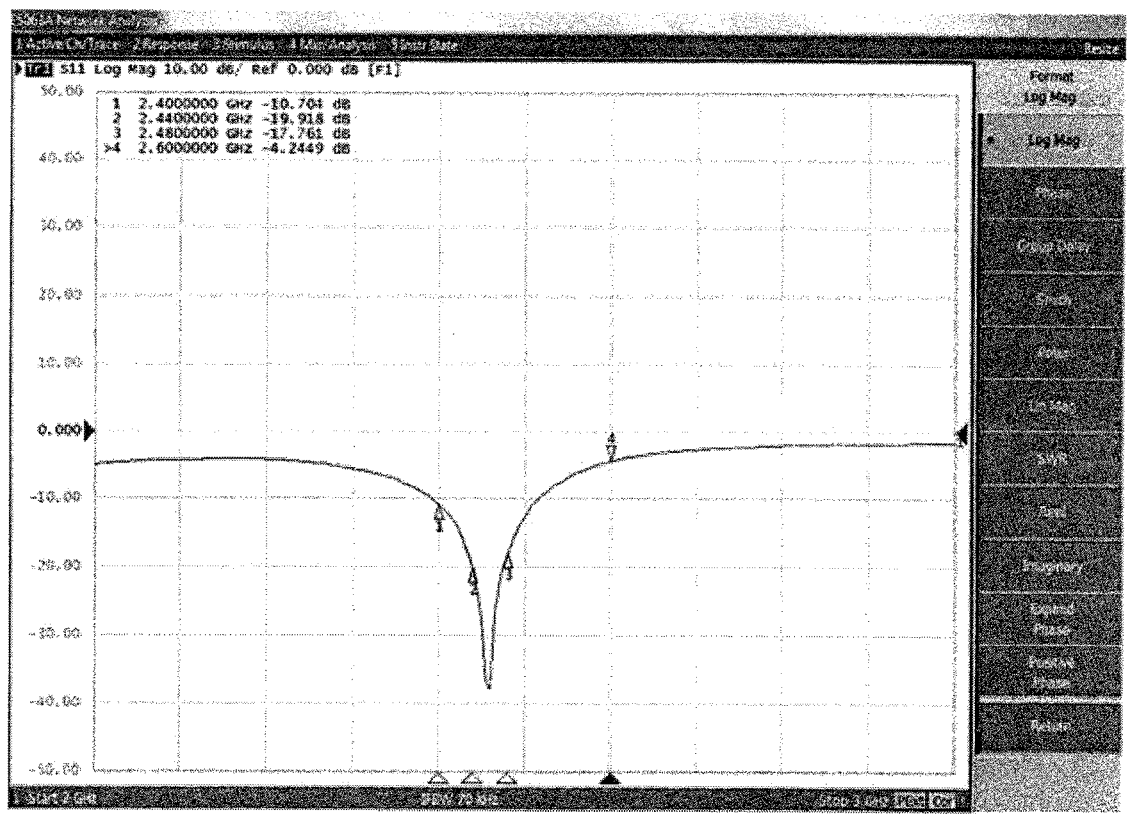
Figure 4C:
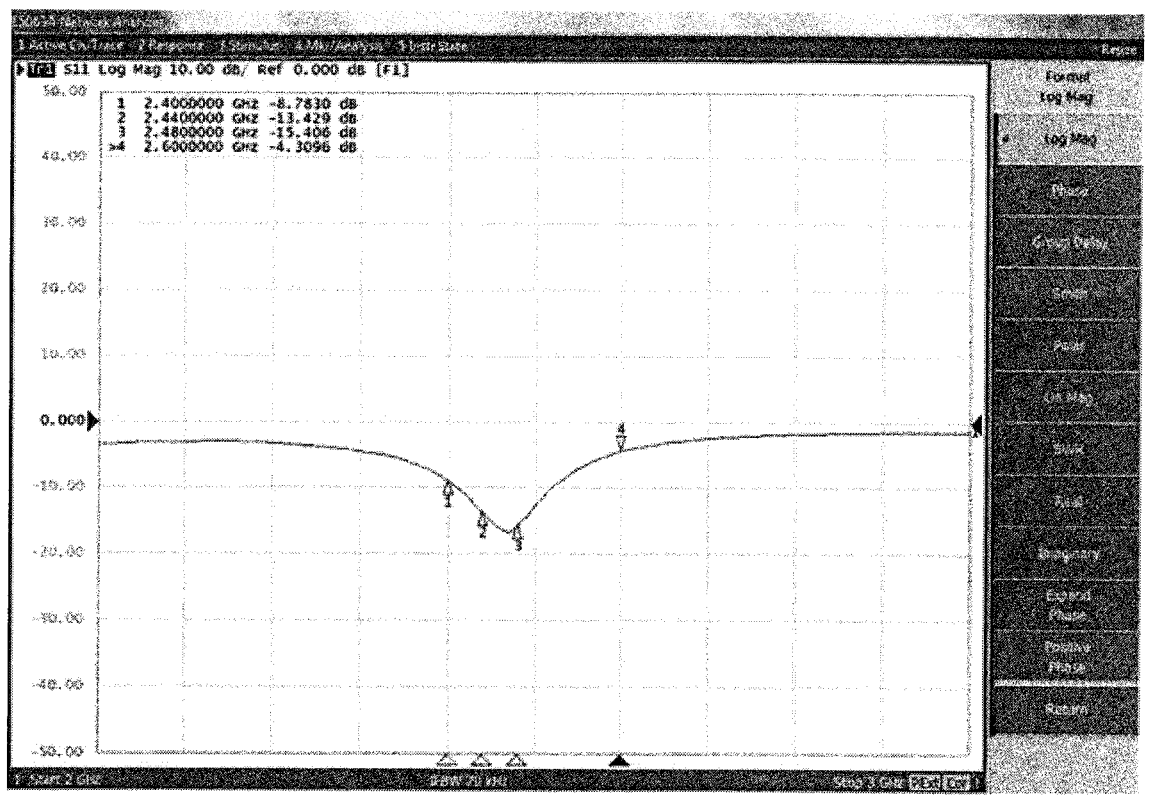
Figure 5A:
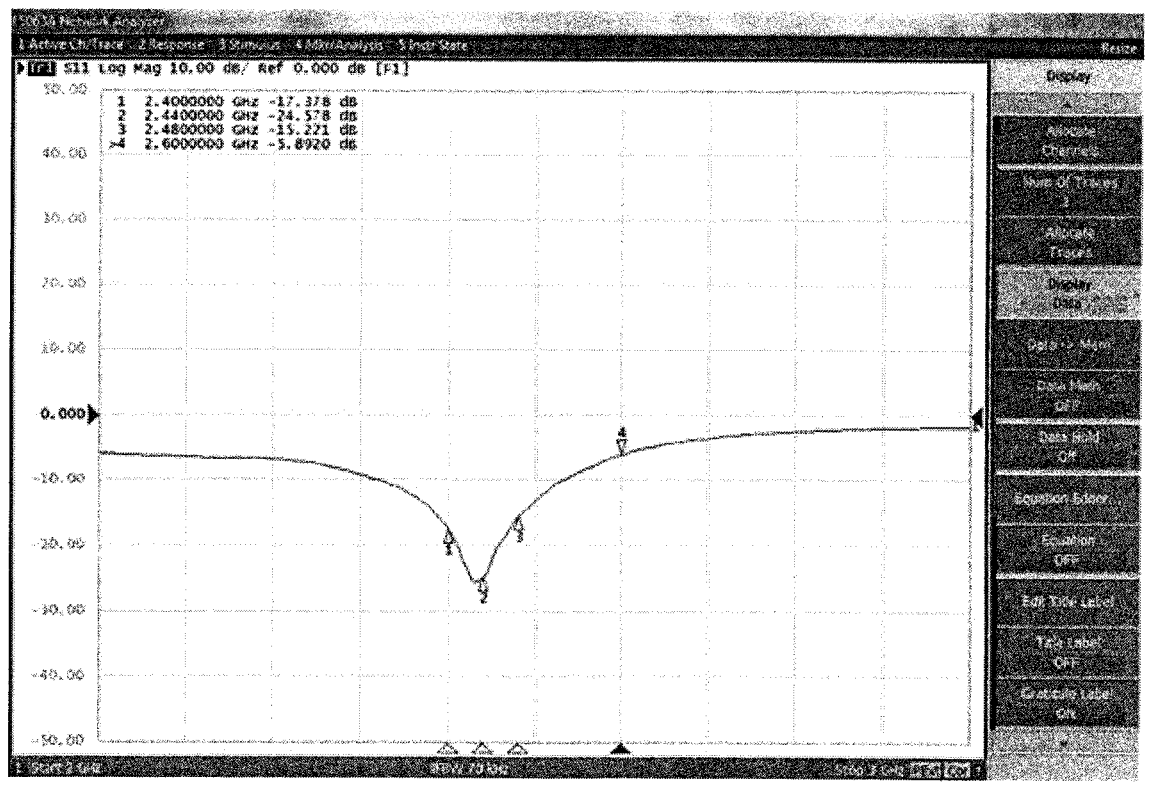
FIGS. 5A, 5B and 5C are graphs showing return loss of three (3) electronic devices manufactured in accordance with embodiments disclosed herein across the 2.4 GHz ISM band.
Figure 5B:
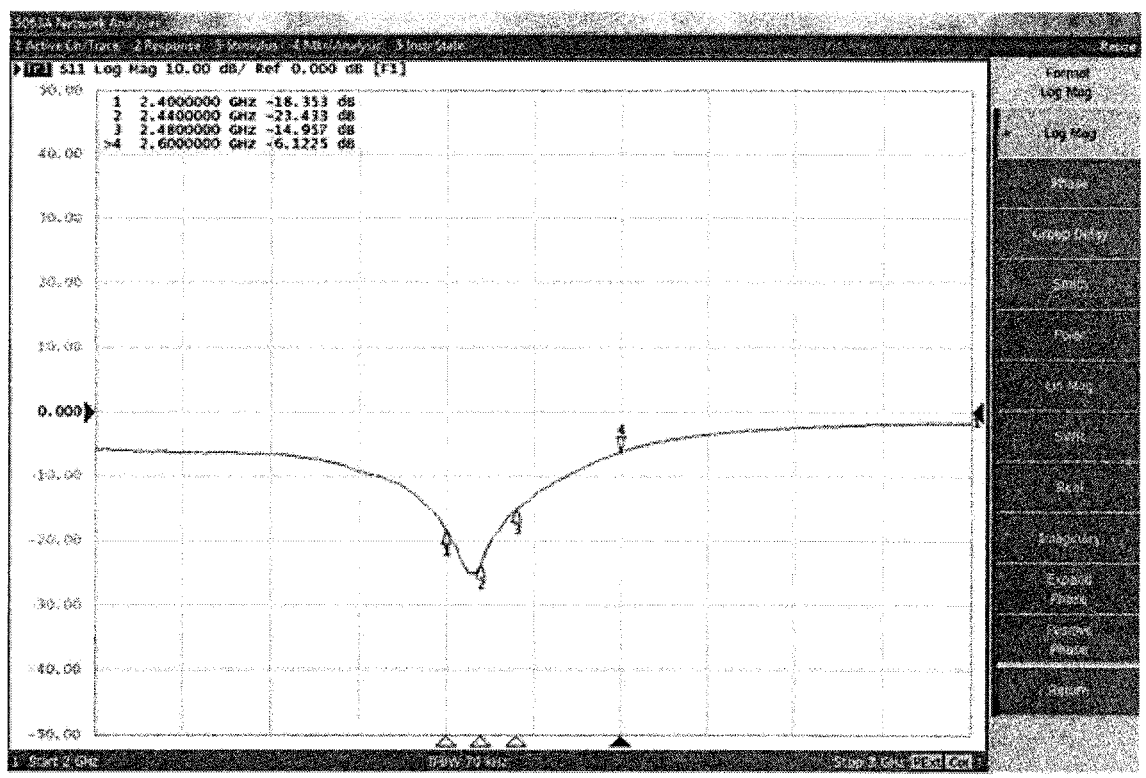
Figure 5C:
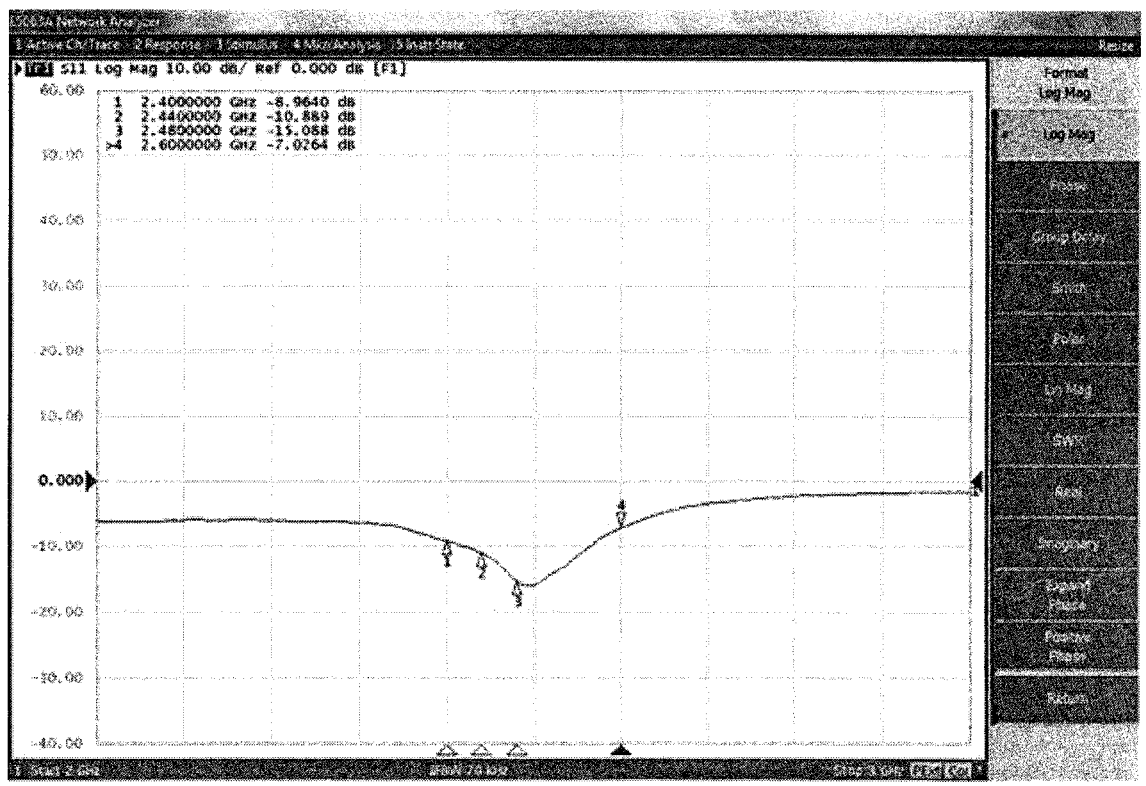

As can be seen from FIG. 3, the antenna efficiency of the devices with caps is higher by between 5% and 20% compared to those without caps across the 2.4 GHz ISM band. FIGS. 4A through 4C and 5A through 5C, also show that the three (3) devices with cap perform better in terms of return loss across the 2.4 GHz ISM band than those without caps.

As is evident from the foregoing discussion, the methods for manufacturing an electronic device described herein provide protection for the RF antenna against external contamination from the environment and external environmental stresses during the manufacturing process. Advantageously, this helps ensure the stability of operation of the RF antenna of the electronic device that is formed within an intended RF band. Further advantageously, by optimizing the matching circuitry of the electronic device against reference parameters from a reference sample before capping and encapsulation, consistency in RF performance may be achieved.

While preferred embodiments have been illustrated and described, it will be clear that the scope of the present disclosure and the appended claims are not limited to the described embodiments only. Numerous modifications, changes, variations, substitutions and equivalents will be apparent to those skilled in the art without departing from the scope of the claims. The manufacturing method of the present invention may be applied to electronic RF devices operating in any frequency such as, for example, the 2.4 GHz ISM band for Bluetooth beacons.

Further, unless the context clearly requires otherwise, throughout the description and the claims, the words "comprise," "comprising," and the like are to be construed in an inclusive as opposed to an exclusive or exhaustive sense; that is to say, in the sense of "including, but not limited to."

What is claimed is:

1. A method for manufacturing an electronic device, comprising:

providing a substrate having a plurality of radio-frequency components provided thereon, the radio-frequency components comprising an antenna and a matching circuitry;

attaching a cap to the substrate over the antenna and the matching circuitry to provide a sealed environment for electronics within to operate; and performing a molding operation to encapsulate the cap and at least a portion of the substrate with a mold compound.

2. The method of claim 1, further comprising optimizing the matching circuitry against a plurality of reference parameters from an unencapsulated antenna before the step of attaching the cap to the substrate.

3. The method of claim 2, wherein optimizing the matching circuitry comprises:

manufacturing a plurality of sample electronic devices, each of the sample electronic devices having the antenna and the matching circuit covered by the cap before the encapsulation; and comparing an antenna performance of successive ones of the sample electronic devices against the reference parameters from the unencapsulated antenna.

4. The method of claim 3, wherein optimizing the matching circuitry further comprises:

tuning the successive ones of the sample electronic devices to compensate for differences between the reference parameters from the unencapsulated antenna and the antenna performance of the successive ones of the sample electronic devices.

5. The method of claim 4, wherein optimizing the matching circuitry further comprises:

tuning the matching circuitry in accordance with a plurality of matching circuitry values determined when the antenna performance of one of the sample electronic devices matches the reference parameters from the unencapsulated antenna.

6. The method of claim 1, wherein attaching the cap to the substrate comprises bonding the cap to the substrate with an adhesive.

7. The method of claim 6, wherein the adhesive comprises a room temperature vulcanizing silicone.

8. The method of claim 1, wherein attaching the cap to the substrate comprises aligning a plurality of pins of the cap with corresponding ones of a plurality of holes in the substrate.

9. The method of claim 8, wherein attaching the cap to the substrate further comprises heat staking the cap to the substrate by means of the pins.

10. The method of claim 1, further comprising machining the cap from a polycarbonate material.

11. The method of claim 1, wherein performing the molding operation comprises:

placing the substrate with the antenna and the matching circuitry sealed by the cap in a mold; and injecting the mold compound into the mold at an injection pressure of from about 1.02 kilograms per square centimetres ($kg/cm^2$) to about 61.2 $kg/cm^2$.

* * * * *